United States Patent
Nagata

(10) Patent No.: US 9,159,401 B2
(45) Date of Patent: Oct. 13, 2015

(54) SEMICONDUCTOR DEVICE HAVING HIERARCHICAL BIT LINE STRUCTURE

(71) Applicant: PS4 Luxco S.a.r.l., Luxembourg (LU)

(72) Inventor: Kyoichi Nagata, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/597,471

(22) Filed: Jan. 15, 2015

(65) Prior Publication Data

US 2015/0124522 A1    May 7, 2015

Related U.S. Application Data

(63) Continuation of application No. 13/767,481, filed on Feb. 14, 2013, now Pat. No. 8,964,439.

(30) Foreign Application Priority Data

Feb. 20, 2012 (JP) ................................. 2012-034566

(51) Int. Cl.

| G11C 5/02 | (2006.01) |
|---|---|
| G11C 5/06 | (2006.01) |
| G11C 11/24 | (2006.01) |
| G11C 7/00 | (2006.01) |
| G11C 7/02 | (2006.01) |
| G11C 11/4091 | (2006.01) |
| G11C 7/12 | (2006.01) |
| G11C 7/08 | (2006.01) |
| G11C 11/4097 | (2006.01) |

(52) U.S. Cl.
CPC .............. *G11C 11/4091* (2013.01); *G11C 7/08* (2013.01); *G11C 7/12* (2013.01); *G11C 11/4097* (2013.01)

(58) Field of Classification Search
USPC .............. 365/51, 63, 149, 203, 205, 207, 208
See application file for complete search history.

(56) References Cited

U.S. PATENT DOCUMENTS

| 5,917,744 A | 6/1999 | Kirihata et al. |
| 5,917,745 A | 6/1999 | Fujii |
| 5,973,983 A | 10/1999 | Hidaka |
| 7,460,388 B2 | 12/2008 | Ilda |
| 8,248,834 B2 | 8/2012 | Narui |
| 8,472,272 B2 | 6/2013 | Kajigaya |
| 8,670,284 B2 | 3/2014 | Nagata |
| 8,693,278 B2 | 4/2014 | Mochida |
| 2012/0300529 A1 | 11/2012 | Narui |

FOREIGN PATENT DOCUMENTS

| JP | 2007-287209 A | 11/2007 |
| JP | 2011-034614 A | 2/2011 |

*Primary Examiner* — Trong Phan

(57) ABSTRACT

A semiconductor device comprises first and second global bit lines, a sense amplifier amplifying a voltage difference of the first and second global bit lines, first and second local bit lines corresponding to the first and second global bit lines, and first and second hierarchical switches controlling electrical connections between the first and second global bit lines and the first and second local bit line. In a precharge operation prior to accessing a selected memory cell belong to the first local bit lines, a pair of the first and second hierarchical switches, which is not in an access path, is kept ON, and remaining ones thereof are kept OFF. Subsequently, in an access to the selected memory cell, a first hierarchical switch of the pair is switched from ON to OFF, and simultaneously a first hierarchical switches in the access path is switched from OFF to ON.

11 Claims, 10 Drawing Sheets

SEMICONDUCTOR DEVICE HAVING HIERARCHICAL BIT LINE STRUCTURE

CROSS REFERENCE TO RELATED APPLICATIONS

This application is a continuation of U.S. application Ser. No. 13/767,481, filed Feb. 14, 2013, now U.S. Pat. No. 8,964, 439, issued on Feb. 24, 2015, which claims benefit of priority from the prior Japanese Application No. 2012-034566, filed on Feb. 20, 2012, the entire contents of all of which are incorporated herein by reference.

BACKGROUND OF THE INVENTION

1. Field of the Invention

The present invention relates to a semiconductor device comprising a memory cell array in which bit lines are hierarchized.

2. Description of Related Art

In recent years, miniaturization and shrinking of semiconductor devices such as DRAM have advanced with a change in generation of manufacturing processes. In order to achieve both the miniaturization and shrinking thereof, a configuration in which bit lines are hierarchized can be employed. For example, Patent Reference 1 discloses a memory cell array in which bit lines having an open bit line structure are hierarchized. Further, for example, Patent Reference 2 discloses a control method of hierarchical switches of a memory cell array having a hierarchical bit line structure.

[Patent Reference 1] Japanese Patent Application Laid-open No. 2011-034614 (U.S. Pat. No. 8,248,834) [Patent Reference 2] Japanese Patent Application Laid-open No. 2007-287209 (U.S. Pat. No. 7,460,388) In a read or write operation of an above-described conventional hierarchical memory cell array, a hierarchical switch in an access path of a selected memory cell is switched to an ON-state first so that a local bit line is connected to a global bit line, and other hierarchical switches are switched to an OFF-state. Thereby, non-selected local bit lines are disconnected from the global bit line, and the selected memory cell can be accessed in a state where bit line capacitance is substantially lowered. Further, in a precharge operation, all hierarchical switches are switched to an OFF-state in order to prepare a subsequent access.

However, the above control requires the hierarchical switch in the access path to be switched from the OFF-state to the ON-state when accessing the selected memory cell. Therefore, noise generated due to the switching increases the potential of the global bit line, which causes a problem that sensing margin of a sense amplifier deteriorates. Further, since the sense amplifier has a differential type configuration, it is possible to cancel the noise viewed from the sense amplifier by controlling the hierarchical switch so as to add in-phase noise to a complementary global bit line (see FIGS. 6 and 7). However, when applying such control, consumption current increases due to an increased number of switching controls to turn on/off the hierarchical switch, and it is inevitable that the sensing margin deteriorates particularly when reading high-level data since fluctuation in potential of the global bit line remains. Further, there arises a problem that a time (tRP) for transitioning from a precharge operation to an active operation is prolonged due to influence of coupling noise that is caused by the control to switch the hierarchical to the OFF-state in the precharge operation.

SUMMARY

One of aspects of the invention is a semiconductor device comprising: a first global bit line; a second global bit line; a sense amplifier amplifying a voltage difference between the first and second global bit lines; a plurality of first local bit lines arranged corresponding to the first global bit line; a plurality of second local bit lines arranged corresponding to the second global bit line; a plurality of first hierarchical switches controlling electrical connections between the first global bit line and the first local bit lines, respectively; a plurality of second hierarchical switches controlling electrical connections between the second global bit line and the second local bit lines, respectively; and a control circuit controlling an operation of the sense amplifier and operations of the first and second hierarchical switches, wherein, in a precharge operation prior to an access to a selected memory cell coupled to one of the first local bit lines, the control circuit keeps a pair of the first and second hierarchical switches in an ON-state and keeps remaining ones of the first and second hierarchical switches in an OFF-state, the pair of first and second hierarchical switches not being in an access path of the selected memory cell, and, in the access to the selected memory cell, the control circuit switches a first hierarchical switch of the pair of the first and second hierarchical switches from the ON-state to an OFF-state, and simultaneously switches one of the first hierarchical switches that is in the access path from the OFF-state to an ON-state.

DETAILED DESCRIPTION OF THE PREFERRED EMBODIMENTS

Embodiments of the present invention will be described in detail below with reference to accompanying drawings. In the following embodiments, the present invention will be applied to DRAM (Dynamic Random Access Memory) as an example of a semiconductor device comprising a memory cell array in which bit lines are hierarchized. However, the present invention is not limited to the embodiments described below.

Figure 1:
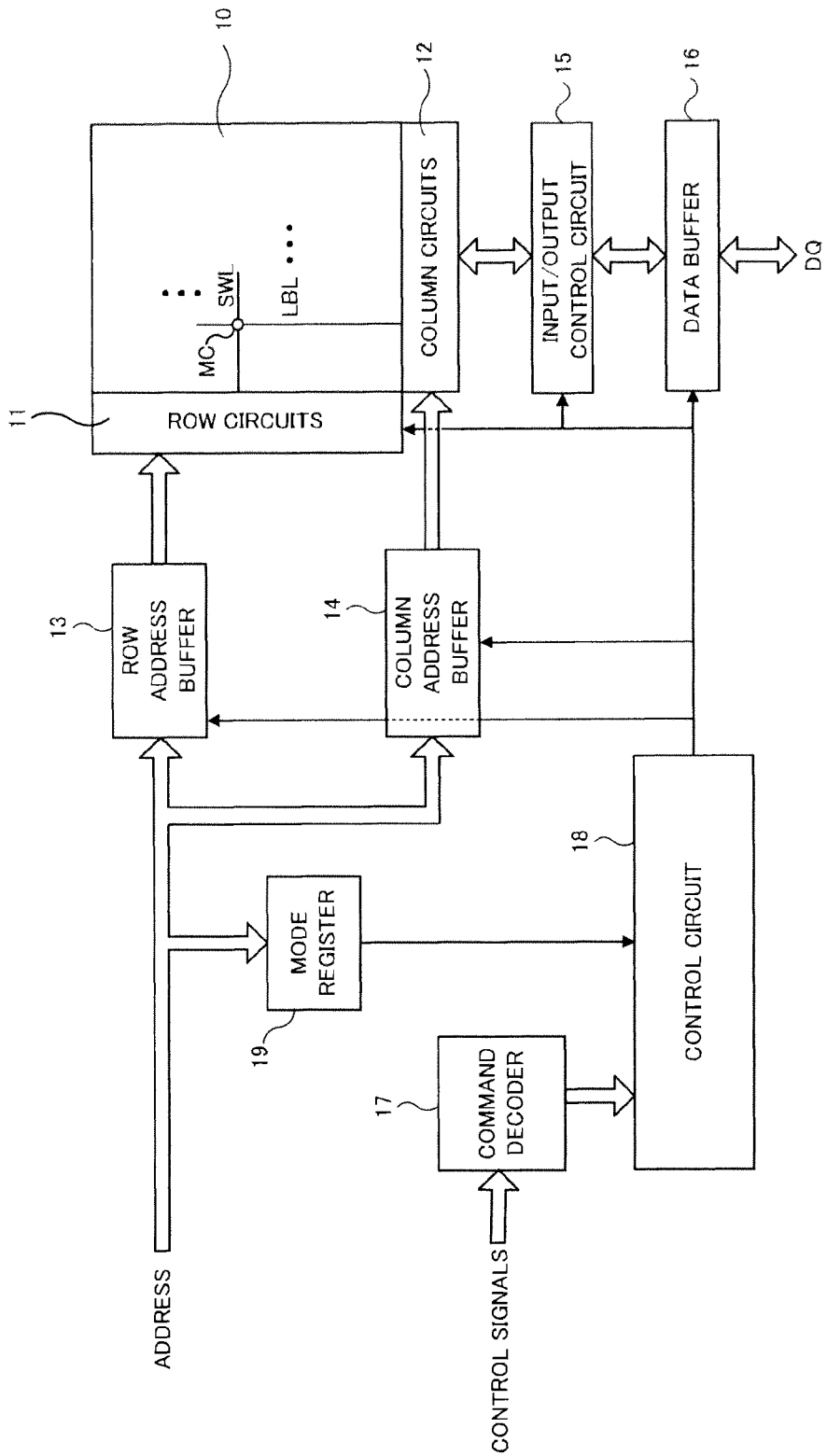
FIG. 1 is a block diagram showing a schematic configuration of DRAM of an embodiment.

FIG. 1 is a block diagram showing a schematic configuration of the DRAM as the semiconductor device of an embodiment. The semiconductor device shown in FIG. 1 comprises a memory cell array 10 that includes many memory cells MC arranged at intersections of a plurality of local bit lines LBL and a plurality of sub-word lines SWL, and row circuits 11 and column circuits 12 that are attached to the memory cell array 10. In the memory cell array 10 of FIG. 1, a bit line structure is hierarchized into global bit lines GBL (FIG. 2) and the local bit lines LBL, and a word line structure is hierarchized into main word lines MWL and the sub-word lines SWL. The row circuits 11 include many circuits associated with the hierarchical word lines and the column circuits 12 include many circuits associated with the hierarchical bit lines.

An externally input address includes a row address and a column address. The row address is stored in a row address buffer 13 and sent to the row circuits 11. The column address is stored in a column address buffer 14 and sent to the column circuits 12. Data transfer between the column circuits 12 and a data buffer 16 is controlled by an input/output control circuit 15, and the data is transferred from/to outside via input/output data terminals (DQ). A command decoder 17 determines a command for the DRAM based on externally input control signals and sends the command to a control circuit 18. The control circuit 18 controls operations of respective parts of the DRAM in accordance with a command type determined by the command decoder 17. A mode register 19 selectively sets operation modes of the DRAM based on the above address and sends setting information to the control circuit 18.

Figure 2:
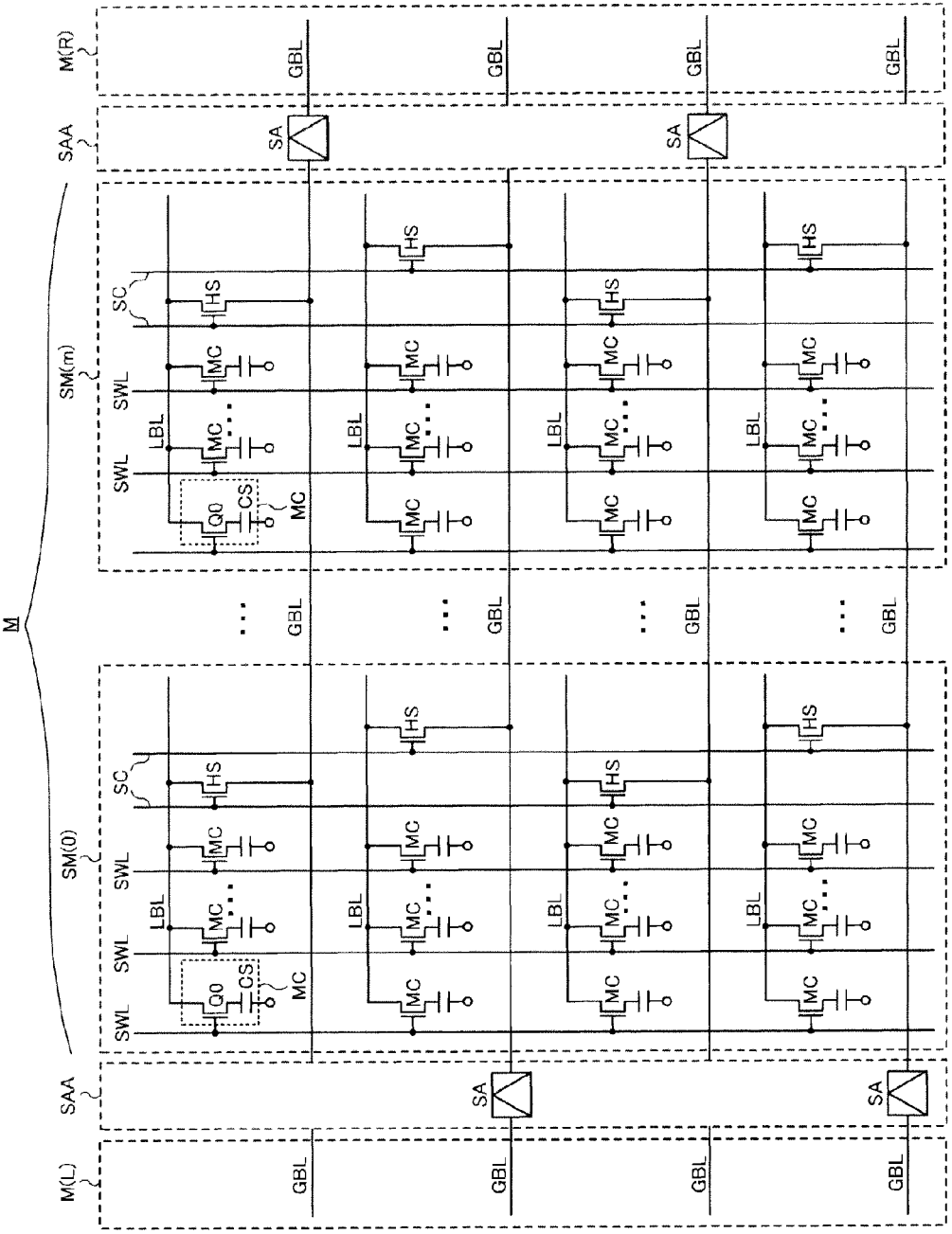
FIG. 2 is a diagram showing a circuit configuration of a main part of a memory cell array in the DRAM of FIG. 1.

FIG. 2 is a diagram showing a circuit configuration of a main part of the memory cell array 10 in the DRAM of the embodiment. The memory cell array 10 includes a plurality of memory mats M each of which is a unit area. The example of FIG. 2 shows a range including one memory mat M and two sense amplifier arrays SAA on both sides thereof. Here, FIG. 2 shows a memory mat M(L) arranged on the left side of the memory mat M via one sense amplifier array SAA and a memory mat M(R) arranged on the right side of the memory mat M via the other sense amplifier array SAA. Further, each of the memory mats M is partitioned into a plurality of sub-mats SM. In the example of FIG. 2, the one memory mat M is partitioned into m+1 sub-mats SM(0) to SM(m).

As described above, the bit lines in the memory mat M are hierarchized into the global bit lines GBL and the local bit lines LBL. As shown in FIG. 2, each of the global bit lines GBL extends over the m+1 sub-mats SM (0) to SM (m) in the memory mat M. A plurality of global bit lines GBL are alternately connected to sense amplifiers SA included in the sense amplifier arrays SAA on both sides in their arrangement order. The memory mat M shown in FIG. 2 has an open bit line structure, and each of the sense amplifiers SA is coupled to two global bit lines GBL arranged at symmetric positions on both sides. Each of the sense amplifiers SA has a differential type configuration to amplify a voltage difference between signals transmitted through the global bit lines GBL on both sides.

In each of the sub-mats SM, there are arranged the local bit lines LBL whose number is the same as the global bit lines GBL. That is, m+1 local bit lines LBL aligned on the same straight line in the m+1 sub-mats SM correspond to each one of the global bit lines GBL. Thus, assuming that L global bit lines GBL are arranged in the entire memory mat M, L×(m+1) local bit lines LBL are to be arranged therein.

Further, the word lines of the memory mat M are hierarchized into the main word lines MWL and the sub-word lines SWL, as described above. However, FIG. 2 shows only the sub-word lines SWL, and the main word lines MWL are omitted. A predetermined number of sub-word lines SWL are arranged in each of the sub-mats SM, and a plurality of memory cells MC are formed at intersections of the local bit lines LBL and the sub-word lines SWL in each of the sub-mats SM. Each of the memory cells MC is composed of a selection transistor Q0 selectively switched by a sub-word line SWL and a capacitor CS storing data as electric charge. Further, a plurality of hierarchical switches HS connected to respective ends of the plurality of local bit lines LBL are arranged in each of the sub-mats SM. Each of the hierarchical switches HS is an NMOS type transistor that controls an electrical connection between a global bit line GBL and a local bit line LBL in response to a switch control signal SC applied to its gate. The hierarchical switches HS whose number is the same as the local bit lines LBL exist in the memory mat M of FIG. 2. Although two lines for the switch control signal SC are arranged in parallel in each of the sub-mats SM in the example of FIG. 2, a configuration can be employed without being limited to this arrangement, in which, for example, one line for the switch control signal SC may be arranged in each of the sub-mats SM.

Figure 3:
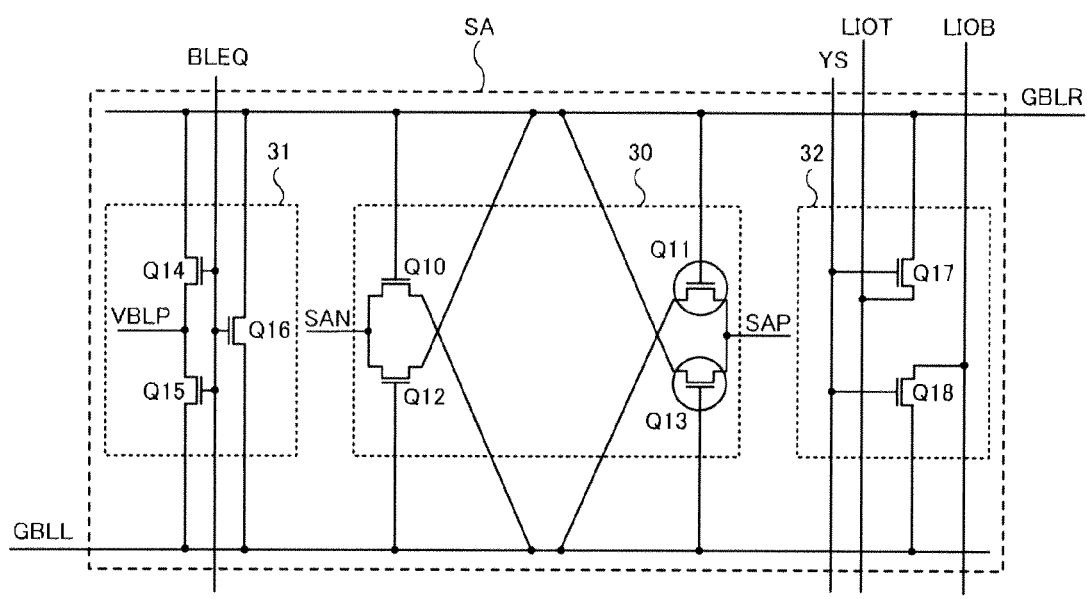
FIG. 3 is a diagram showing a circuit configuration example of a sense amplifier in a sense amplifier array of FIG. 2.

FIG. 3 shows a circuit configuration example of the sense amplifier SA in the sense amplifier array SAA of FIG. 2. The differential type sense amplifier SA shown in FIG. 3 is connected to one global bit line GBLR in the right-side memory mat M and to one global bit line GBLL in the left-side memory mat M, and a pair of the global bit lines GBLL and GBLR forms a complementary pair. The sense amplifier SA includes a cross coupled circuit 30, a precharge/equalize circuit 31, and an input/output port 32. In the cross coupled circuit 30, a pair of transistors Q10 (NMOS) and Q11 (PMOS) forming one inverter have gates connected to the global bit line GBLR and a pair of transistors Q12 (NMOS) and Q13 (PHOS) forming the other inverter have gates connected to the global bit line GBLL. Each of the inverters functions as a latch circuit in which inputs and outputs thereof are cross-coupled to each other. The cross coupled circuit 30 is activated by a pair of sense amplifier control signals SAP and SAN and determines a voltage difference between the global bit lines GBLR and GBLL in binary in order to latch it.

The precharge/equalize circuit 31 includes three NMOS type transistors Q14, Q15 and Q16 having gates to which a bit line equalizing signal BLEQ is applied. The transistors Q14 and Q15 are a precharge circuit that precharges the respective global bit lines GBLR and GBLL to a precharge voltage VBLP when the bit line equalizing signal BLEQ is at a high level. The transistor Q16 is an equalizing circuit that equalizes a pair of global bit lines GBLR and GBLL when the bit line equalizing signal BLEQ is at the high level. The input/output port 32 includes a pair of NMOS type transistors Q17 and Q18 controlling electrical connections between the pair of global bit lines GBLL and GBLR and a pair of local input/output lines LIOT and LIOB in response to a selection signal YS applied to gates thereof. When the selection signal YS is at a high level, the global bit line GBLR is connected to the local input/output line LIOT through the transistor Q17 and the global bit line GBLL is connected to the local input/output line LIOB through the transistor Q18.

Figure 4:
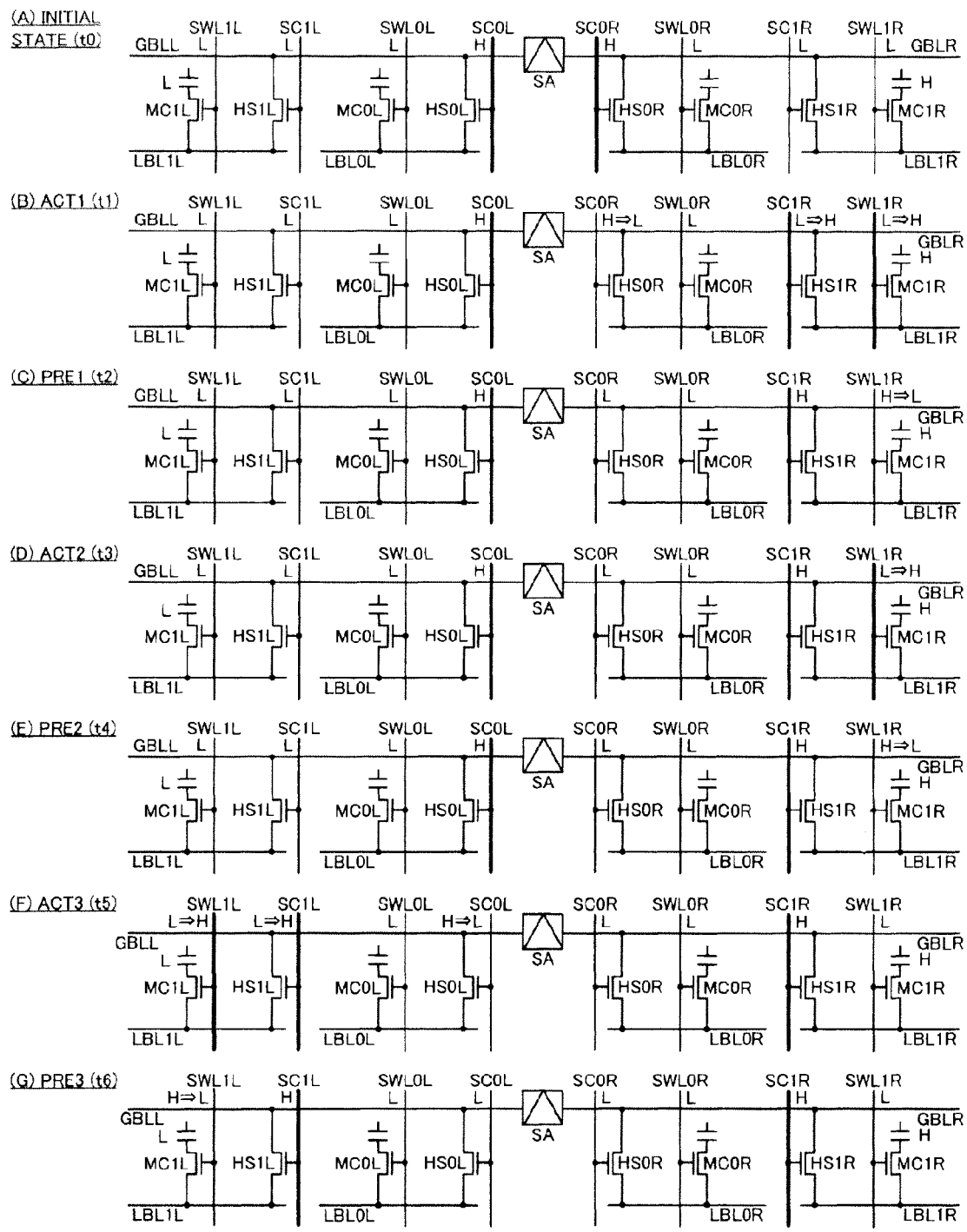
FIG. 4 is a state transition diagram in controlling a memory mat of the embodiments.
Figure 5:
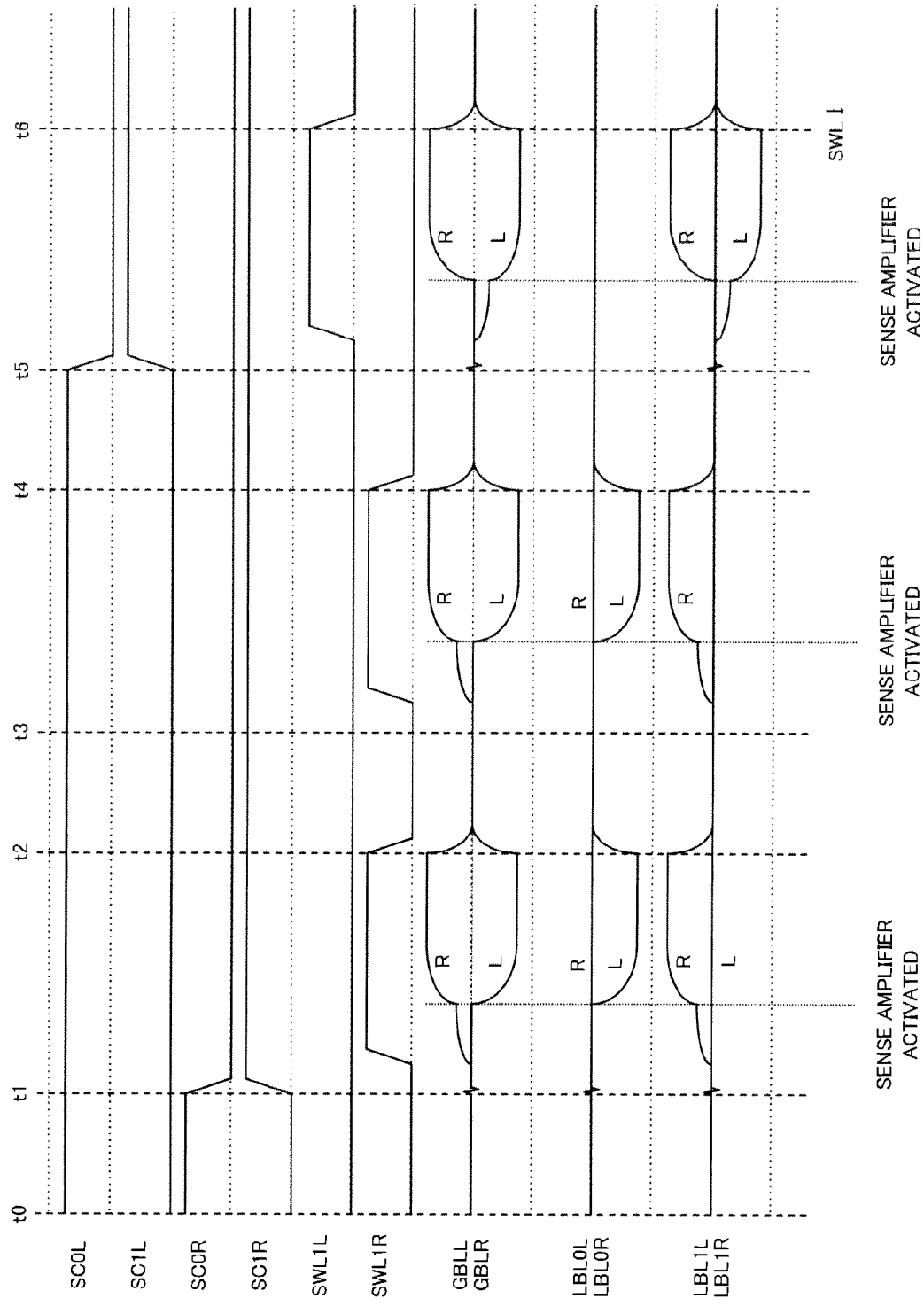
FIG. 5 is an operation waveform diagram corresponding to FIG. 4.

Next, operations of the DRAM of the embodiments will be described with reference to FIGS. 4 to 9. Hereinafter, a control for the memory mat M of the DRAM of the embodiments will be described, and two comparison examples based on general controls in case of not applying the control of the embodiments will be described in order to compare with the control of the embodiments. FIG. 4 shows a state transition diagram in controlling the memory mat M of the embodiments, and FIG. 5 shows an operation waveform diagram corresponding to FIG. 4. Further, FIGS. 6 and 7 show a state transition diagram and an operation waveform diagram in a first comparison example, which correspond to FIGS. 4 and 5, respectively, and FIGS. 8 and 9 show a state transition diagram and an operation waveform diagram in a second comparison example, which correspond to FIGS. 4 and 5, respectively.

Figure 6:
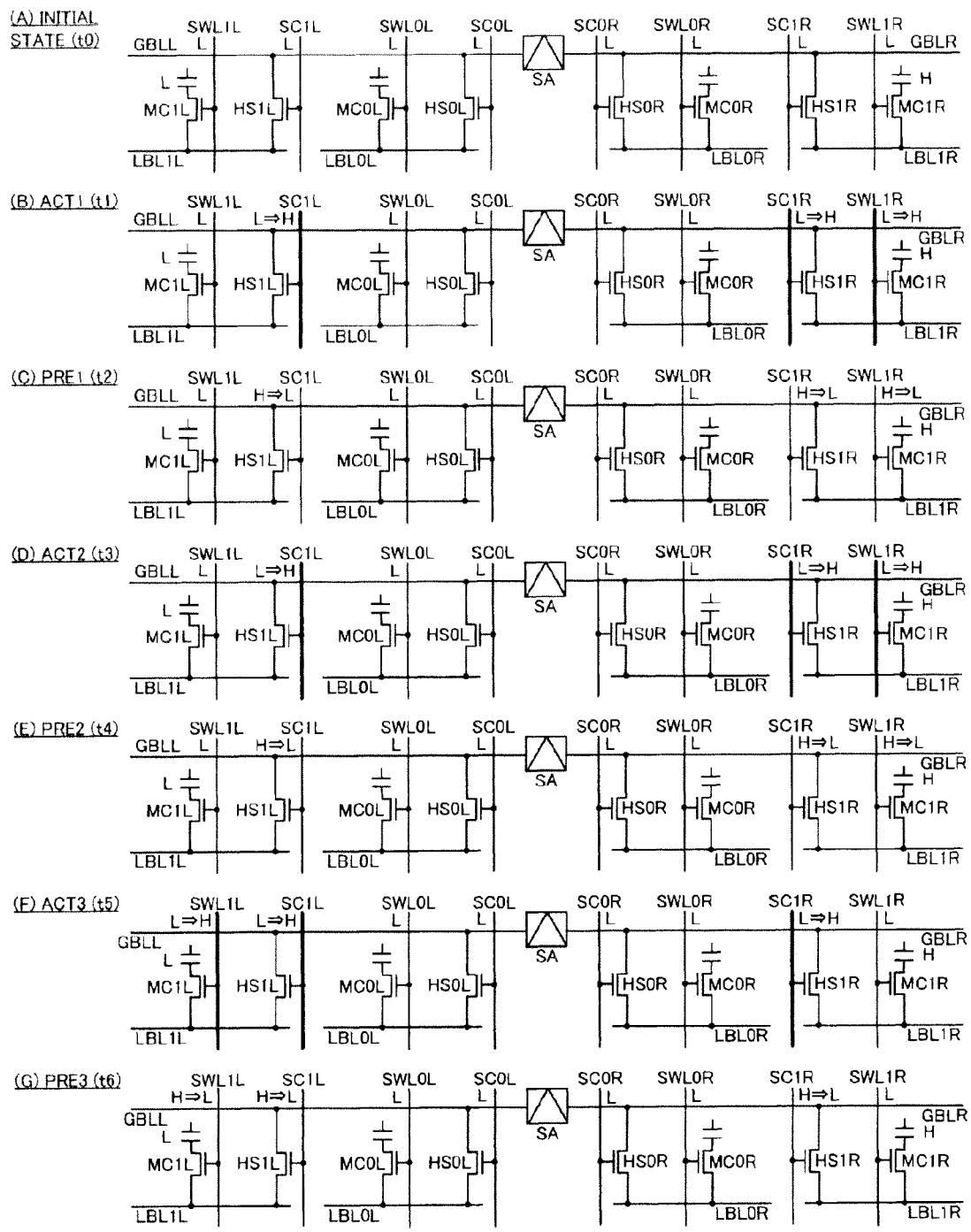
FIG. 6 is a state transition diagram in controlling a memory mat of a first comparison example.
Figure 7:
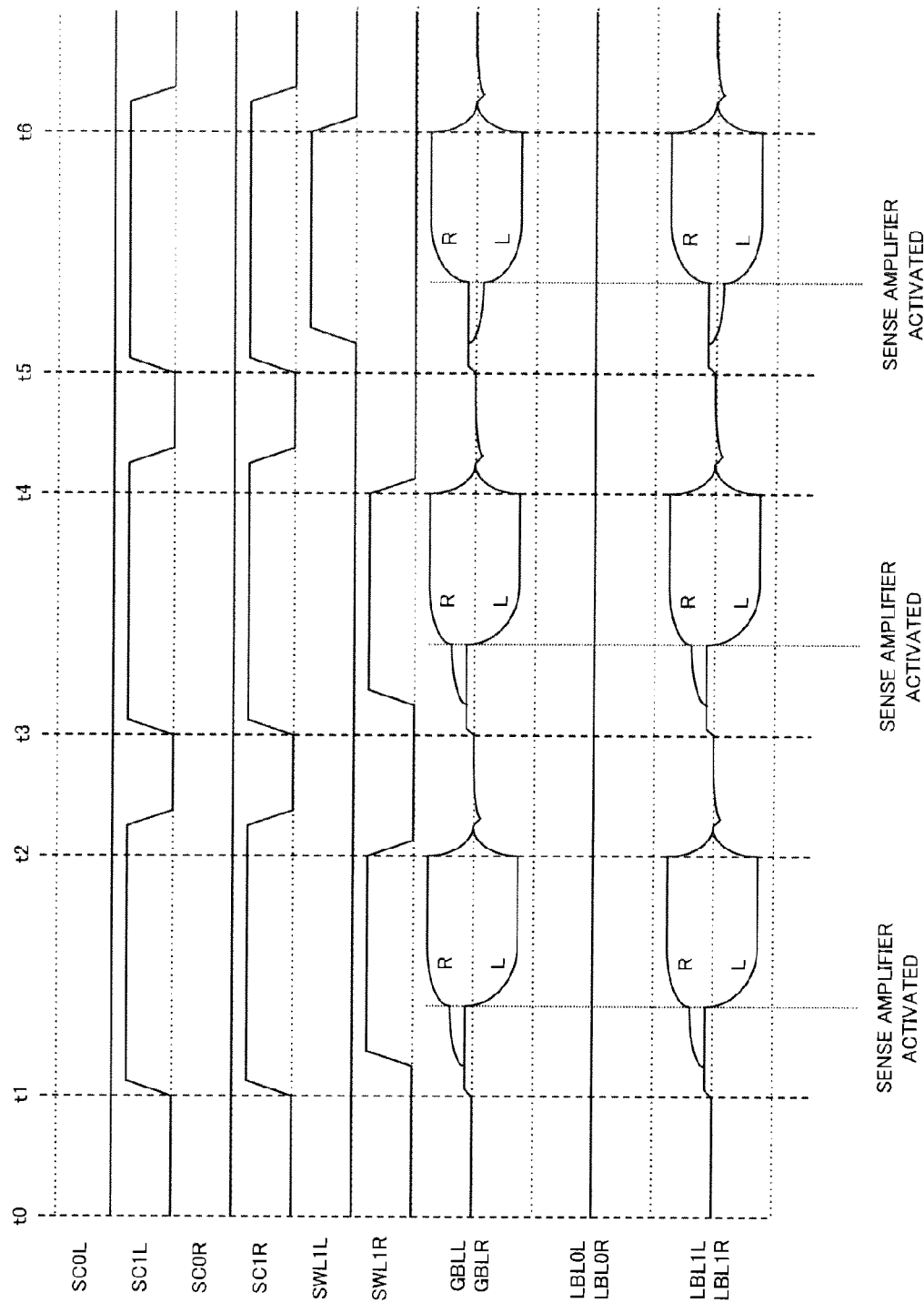
FIG. 7 is an operation waveform diagram corresponding to FIG. 6.
Figure 8:
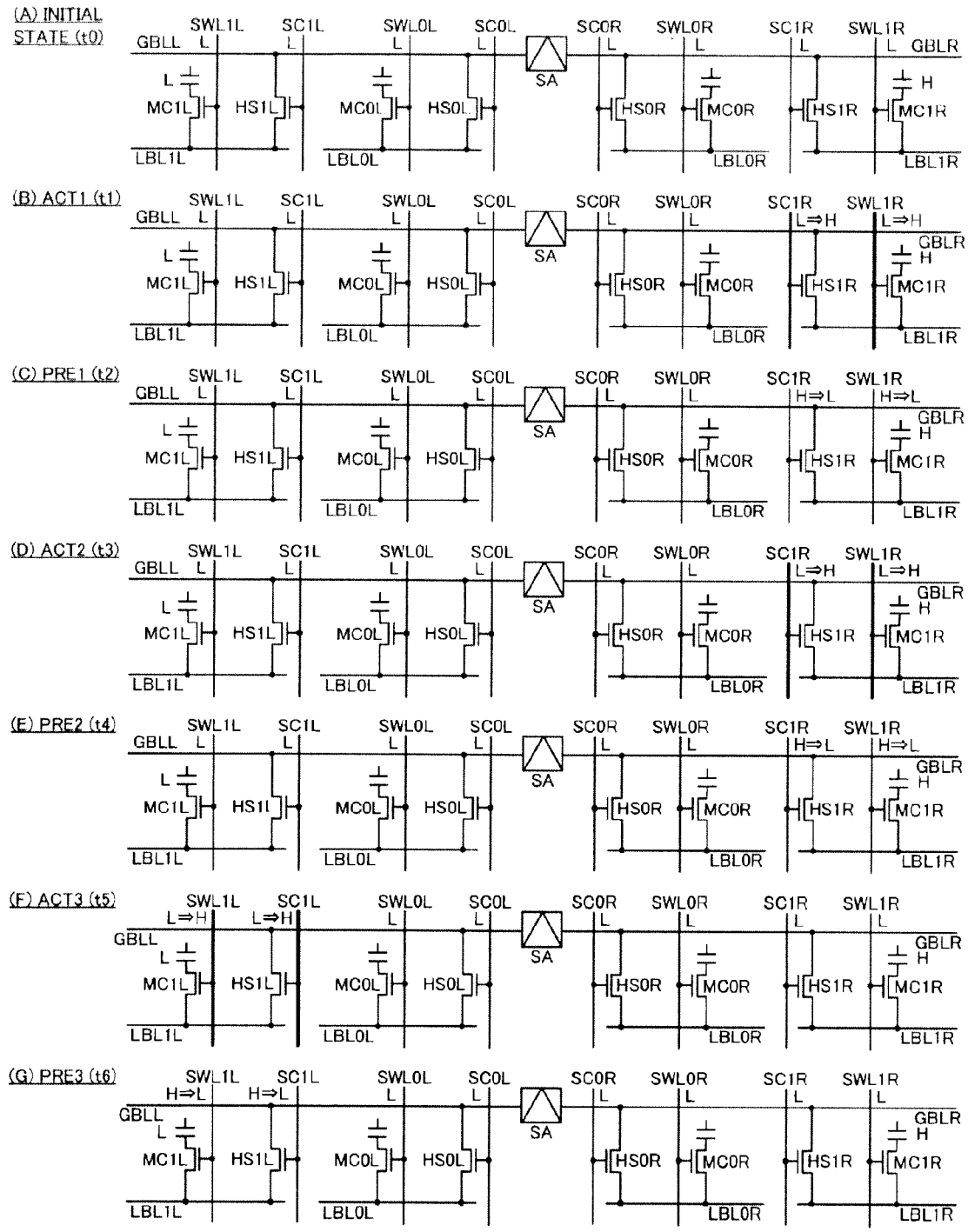
FIG. 8 is a state transition diagram in controlling a memory mat of a second comparison example.
Figure 9:
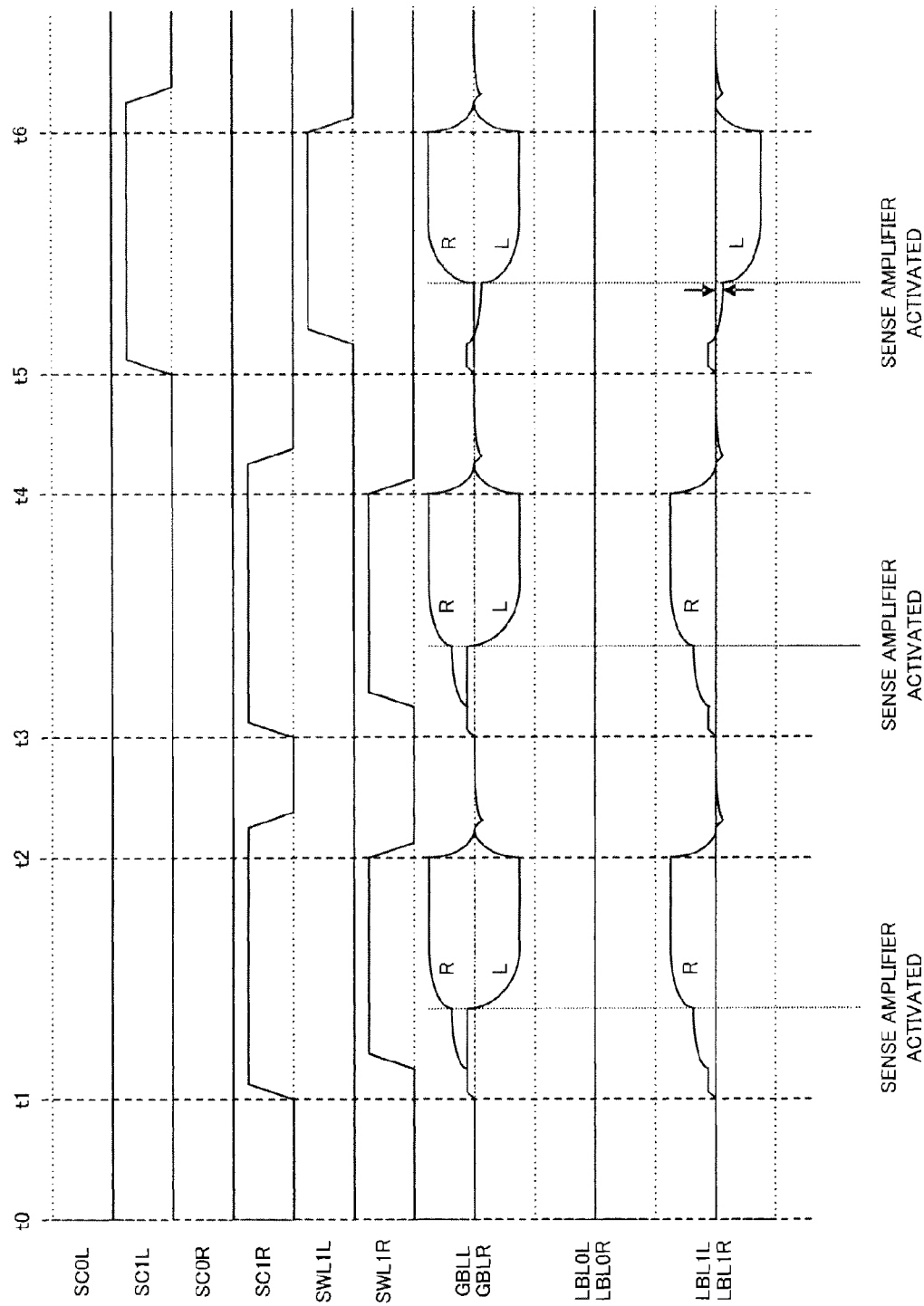
FIG. 9 is an operation waveform diagram corresponding to FIG. 8.

Each of states included in the state transition diagrams of FIGS. 4, 6 and 8 shows a partial configuration within a range of four sub-mats SM in total, two of which are on the left, the other two of which are on the right, with respect to one sense amplifier SA at the center in the memory mat M of FIG. 2. Specifically, on the right side of the sense amplifier SA, one global bit line GBLR (first global bit line), two local bit lines LBL0R and LBL1R (two first local bit lines), two hierarchical switches HS0R and HS1R (two first hierarchical switches) and two memory cells MC0R and MC1R are respectively shown, and on the left side of the sense amplifier SA, one global bit line GBLL (second global bit line), two local bit lines LBL0L and LBL0L (two second local bit lines), two hierarchical switches HS0L and HS1L (two second hierarchical switches) and two memory cells MC0L and MC1L are respectively shown. In FIGS. 4, 6 and 8, only one memory cell MC is indicated in each sub-mat SM and other memory cells MC are omitted for the purpose of easily understanding the operations. Further, four sub-word lines SWL (SWL1L, SWL0L, SWL0R and SWL1R) and four switch control signal SC in each state are attached with high level (H) or low level (L), respectively, and represented by lines of different widths (the high level (H) is represented by a heavy line).

A state (A) of FIG. 4 is an initial state (precharge operation) in controlling the memory mat M of the embodiments, and corresponds to operation waveforms at a timing t0 of FIG. 5. In the initial state, all memory cells MC are in a non-selected state. Further, the capacitor CS of a selected memory cell (memory cell MC1R) stores high-level data when being accessed (active operation) as described later, and the capacitor CS of the memory cell MC1L located at a position symmetric to the memory cell MC1R via the sense amplifier SA stores low-level data. In the initial state, the precharge operation is performed prior to a read operation of the memory cell MC1R. At this point, all of the global bit lines GBLR and GBLL and the local bit lines LBL0R, LBL1R, LBL0L and LBL1L have been precharged to the precharge voltage VBLP by the operation of the precharge/equalize circuit 31 of the sense amplifier SA, as shown at the timing t0 of FIG. 5. Further, each of a pair of hierarchical switches HS0R and HS0L located on both sides of the sense amplifier SA is in an ON-state by setting switch control signals SC0R and SC0L to a high level. In addition, all other hierarchical switches HS1R and HS1L are in an OFF state.

A state (B) of FIG. 4 is a state when the state (A) as the initial state of FIG. 4 transitions to an active operation (ACT1) for accessing the memory cell MC1R, and corresponds to operation waveforms at a timing t1 of FIG. 5. At the timing t1 of FIG. 5, the switch control signal SC0R transitions from a high level to a low level, and a switch control signal SC1R simultaneously transitions from a low level to a high level. Thereby, the hierarchical switch HS0R is switched to an OFF-state, and the hierarchical switch HS1R in the access path is switched to an ON-state. Further, the hierarchical switch HS0L on the left side remains in an ON-state. Thereafter, by driving the sub-word line SWL1R to a high level, data of the selected memory cell MC1R is read out to the local bit line LBL1R, and is also read out to the global bit line GBLR through the hierarchical switch HS1R. As shown in FIG. 5, when the sense amplifier SA is activated after completion of the reading, a voltage difference of the pair of global bit lines GBLR and GBLL is amplified, and potentials of the local bit lines LBL0L and LBL1R that are connected via the hierarchical switches HS0L and HS1R in the ON-state change in the same manner.

In this manner, noise occurs due to switching the hierarchical switch HS1R in the access path to the ON-state when reading the selected memory cell MC1R. However, this noise can be cancelled by switching the hierarchical switch HS0R of the non-selected memory cell MOOR from the ON-state to the OFF-state. That is, only a slight level fluctuation temporarily occurs in the local bit line LBL1R at the timing t1 of FIG. 5, and thereafter the potential of the local bit line LBL1R remains stable until the sub-word line SWL1R is driven to the high level.

A state (C) of FIG. 4 is a state when transitioning to a precharge operation (PRE1) prior to a second read operation of the memory cell MC1R, and corresponds to operation waveforms at a timing t2 of FIG. 5. At the timing t2 of FIG. 5, the sub-word line SWL1R returns to the low level and the memory cell MC1R is disconnected from the local bit line LBL1R. Thereby, respective potentials of the global bit lines GBLR and GBLL and the local bit lines LBL0L and LBL1R are balanced so as to be precharged to the precharge voltage VBLP, respectively. Although the sense amplifier SA is deactivated at this point, the hierarchical switches HS0L and HS1R remain in the ON-state by keeping the switch control signals SC0L and SC1R at the high level.

A state (D) of FIG. 4 is a state when the state (C) of FIG. 4 transitions to a second active operation (ACT2) for accessing the memory cell MC1R, and corresponds to operation waveforms at a timing t3 of FIG. 5. The respective switch control signals SC do not change at the timing t3 of FIG. 5, and the hierarchical switches HS0L and HS1R remain in the ON-state. Thereafter, by driving the sub-word line SWL1R to a high level, data of the selected memory cell MC1R is read out through a path of the local bit line LBL1R, the hierarchical switch HS1R and the global bit line GBLR, and the data is amplified by the sense amplifier SA after completion of the reading, in the same operation as the state (B) of FIG. 4. In this manner, the noise does not occur in the second active operation because the hierarchical switch HS is not switched.

A state (E) of FIG. 4 is a state when transitioning to a precharge operation (PRE2) prior to a read operation of another memory cell MC1L, and corresponds to operation waveforms at a timing t4 of FIG. 5. In FIG. 4, the state (E) is the same as the state (C), and the operation waveforms of the state (E) are the same as those of the state (C), so description thereof will be omitted.

A state (F) of FIG. 4 is a state when the state (E) of FIG. 4 transitions to an active operation (ACT3) for accessing the memory cell MC1L located at a position symmetric to the memory cell MC1R, and corresponds to operation waveforms at a timing t5 of FIG. 5. At the timing t5 of FIG. 5, the switch control signal SCOL transitions from a high level to a low level, and a switch control signal SC1L simultaneously transitions from a low level to a high level. Thereby, the hierarchical switch HS0L is switched to an OFF-state, and the hierarchical switch HS1L is switched to an ON-state. Further, the hierarchical switch HS0R on the right side remains in an ON-state. Thereafter, by driving the sub-word line SWL1L to a high level, data of the selected memory cell MC1L is read out to the local bit line LBL1L, and is also read out to the global bit line GBLL through the hierarchical switch HS1L. When the sense amplifier SA is activated after completion of the reading, the voltage difference of the pair of global bit lines GBLR and GBLL is amplified, and the potentials of the local bit lines LBL0L and LBL1R that are connected via the hierarchical switches HS0L and HS1R change in the same manner. In this manner, the operation based on the state (F) of FIG. 4 is common to that of the state (B) of FIG. 4, and the effect of cancelling the noise can be obtained in the same manner as described for the state (B) of FIG. 4.

A state (G) of FIG. 4 is a state when transitioning to a last precharge operation (PRE3), and corresponds to operation waveforms at a timing t6 of FIG. 5. In FIG. 4, the state (G) is the same as the state (C), and the operation waveforms of the state (G) are the same as those of the state (C), so (description thereof will be omitted.

Next, a control of the first comparison example will be described using FIGS. 6 and 7, for the purpose of comparison with the control of the DRAM of the embodiments. A configuration in the first comparison example is assumed to be common to that of the DRAM of the embodiments, and also there are many common points concerning the control in the first comparison example. Therefore, mainly different points will be described below. States (A) to (G) of FIG. 6 are states at the same timings as the states (A) to (G) of FIG. 4, and correspond to the timings t0 to t6 of FIG. 7, respectively.

In a state (A) as an initial state in FIG. 6, all memory cells MC are in a non-selected state and all hierarchical switches HS are in an OFF-state. At this point, the global bit lines GBLR and GBLL and the local bit lines LBL0R, LBL1R, LBL0L and LBL1L are in a state where they are disconnected from each other and have been precharged to the precharge voltage VBLP, respectively. Subsequently, when transitioning to an active operation (ACT1) for accessing the memory cell MC1R, as shown in a state (B) of FIG. 6, the switch control signals SC1R and SC1L are simultaneously transition from a low level to a high level, and thereby the pair of hierarchical switches HS1R and HS1L arranged at symmetric positions on both sides are switched to an ON-state.

At this point, the local bit line LBL1R and the global bit line GBLR of the selected side are connected with each other, and the local bit line LBL1L and the global bit line GBLL at the symmetric positions are connected to each other at the same time. Thereby, in-phase noise is applied to the global bit line GBLR at the complementary side of the sense amplifier SA, which can be balanced. Thereafter, as shown in FIG. 7, a sensing operation of the sense amplifier SA after completion of the driving and reading of the sub-word line SWL1R is performed approximately in the same manner as in FIG. 5. However, changes in potentials of the local bit lines LBL in FIG. 7 are different from those in FIG. 5, reflecting the ON-state of the hierarchical switch HS.

In a state (C) as a precharge operation (PRE1) in FIG. 6, when the sub-word line SWL1R is returned to the low level, respective potentials of the global bit lines GBLR and GBLL and the local bit lines LBL1R and LBL1L are balanced, as shown in FIG. 7. This point is the same as in FIG. 5. However, in the first comparison example, the switch control signals SC1R and SC1L simultaneously transition from the high level to the low level after being balanced. Subsequently, the global bit lines GBLR and GBLL are maintained in a state of being disconnected from the local bit lines LBL1R and LBL1L. Then, as shown in a state (D) of FIG. 6, a second active operation (ACT2) for accessing the memory cell MC1R is started. A control at this point is the same as that in the state (B) of FIG. 6, so description thereof will be omitted. In addition, the same operation is performed when memory cells MC other than the memory cell MC1R are to be accessed.

A state (E) as a precharge operation (PRE2) in FIG. 6 is the same as the state (C) of FIG. 6, so description thereof will be omitted. Subsequently, as shown in a state (F) of FIG. 6, after transitioning to an active operation (ACT3) for accessing the memory cell MC1L located at a position symmetric to above memory cell MC1R, a last precharge operation (PRE3) is started, as shown in a state (G) of FIG. 6. A control at this point is the same as that in the states (B) and (C) of FIG. 6 in consideration of replacing the sub-word line SWL1R with the sub-word line SWL1L, so description thereof will be omitted.

As described above, it is clear from the comparison between operation waveforms of FIGS. 5 and 7 that influence of the noise in the first comparison example is larger in both the active operation and the precharge operation in comparison with the control of the embodiments. Specifically, at the timings t1, t3 and t5 in the active operations of FIG. 7, it is understood that when switching the hierarchical switches HS1R and HS1L to an ON-state by the transition of the switch control signals SC1R and SC1L, potentials of the pair of global bit lines GBLR and GBLL are shifted upward from the precharge voltage VBLP. Although, relative noise between the pair of global bit lines GBLR and GBLL is cancelled by applying the in-phase noise, both potentials of the global bit lines GBLR and GBLL rise to a voltage higher than the precharge voltage VPLP due to influence of remaining in-phase component of the noise. Thereafter, it is inevitable that sensing margin degrades when reading high-level data of the memory cell MC. On the other hand, according to the control of the embodiments, the potentials of the global bit lines GBLR and GBLL are stably maintained at the precharge voltage VBLP when being amplified at the timings t1, t3 and t5 in the active operations of FIG. 5, thereby obtaining excellent sensing margin.

Further, when focusing attention on consumption current in the control of the embodiments and the first comparison example, it is necessary to operate not only the selected hierarchical switch HS (HS1R) but also the non-selected hierarchical switch HS (HS1L) in the first comparison example. Therefore, the consumption current inevitably increases due to driving the hierarchical switches HS. In this case, the hierarchical switches HS formed using the same process as the memory cells MC operate with a boost power supply (VPP), which exert a large influence to increase the consumption current of the entire DRAM. On the other hand, the control of the embodiments is capable of reducing the driving of the hierarchical switches HS, and correspondingly it is possible to suppress an increase in the consumption current.

Furthermore, when the hierarchical switches HS1R and HS1L are switched to the OFF-state by transitioning the switch control signals SC1R and SC1L after the timings t2, t4 and t6 in the precharge operations of FIG. 7, the potentials of the pair of global bit lines GBLR and GBLL have included noises. This is affected by coupling noise that occurs when the switch control signals SC1R and SC1L transition from the high level to the low level. When receiving such coupling noise, it requires a long time to stabilize the global bit line GBL and the local bit line LBL to the precharge voltage VBLP in the precharge operations. Accordingly, the hierarchical switches HS need to be in the OFF-state after setting the sub-word line SW to the low level, and therefore it becomes a problem that a time tRP from a precharge operation to a subsequent active operation is prolonged in the first comparison example. On the other hand, according to the control of the embodiments, since states of the respective hierarchical switches HS are maintained at the timings t2 and t4 of FIG. 5 in the precharge operations without changing the switch control signals SC, it is possible to prevent an increase in the time tRP that is caused by the influence of coupling noise.

Next, a control of the second comparison example will be described using FIGS. 8 and 9, for the purpose of comparison with the control of the DRAM of the embodiments from a different viewpoint. A configuration in the second comparison example is assumed to be common to that of the DRAM of the embodiments, in order to realize a control for suppressing the consumption current in the first comparison example. Most of the control of the second comparison example is common to the first comparison example, and thus different points will be mainly described below. States (A) to (G) of FIG. 8 are states at the same timings as the states (A) to (G) of FIG. 4, and correspond to the timings t0 to t6 of FIG. 9, respectively.

In the second comparison example, a difference from the first comparison example is that only the selected hierarchical switches HS are set to the ON-state by the transition of the switch control signals SC at the timings t1, t3 and t5 in the active operations of FIG. 9 and that the non-selected switches HS are maintained in the OFF-state. For example, only the hierarchical switch HS1R is set to the ON-state at the timings t1 and t3 when reading the memory cell MC1L that stores high-level data. At this point, as shown in FIG. 9, the potentials of the global bit lines GBLR and GBLL and the potentials of the local bit lines LBL0L and LBL1R change in the same manner as in FIG. 7.

Meanwhile, in the second comparison example, at the timing t5 when reading the memory cell MC1L that stores low-level data, the global bit line GBLL of the selected side temporarily rises and thereafter falls to a stabilized potential that is higher than an assumed level due to the transition of the switch control signal SC1L from the low level to the high level. At this point, since the potential of the non-selected global bit line GBLR is maintained at the precharge voltage VBLP, it becomes a problem that an initial voltage difference between the pair of global bit lines GBLR and GBLL decreases, thereby deteriorating the sensing margin. In this manner, even if the second comparison example is capable of reducing the driving of the hierarchical switches HS so that the consumption current is relatively suppressed in comparison with the first comparison example, the deterioration of the sensing margin is inevitable, and particularly performance deterioration becomes remarkable for process products of 40 nm or less in which the capacitor CS of each memory cell MC is very small. On the other hand, according to the control of the embodiments, the decrease in the initial voltage difference between the pair of global bit lines GBLR and GBLL due to the transition of the switch control signals SC does not appear, and therefore it is possible to achieve both the excellent sensing margin and the reduction in the consumption current.

Although the DRAM of the embodiments has been described, each of the configurations and controls disclosed in the embodiments is an example, and various modifications can be employed. For example, when transitioning to the state (B) as the active operation (ACT1) in FIG. 4, the hierarchical switch HS0L at the side of the global bit line GBLL may be switched from the ON-state to the OFF-state and simultaneously the hierarchical switch HS1L at the position symmetric to the hierarchical switch HS1R in the access path may be switched from the OFF-state to the ON-state. In this case, when transitioning to the subsequent precharge operation (PRE1), it is possible to set a state where the global bit lines GBLR and GBLL and the local bit lines LBL1R and LBL1L are connected to each other, respectively, in a symmetric arrangement on both sides of the sense amplifier SA, through the hierarchical switches HS1R and HS1L that are located with the same distance from the sense amplifier SA.

Figure 10:
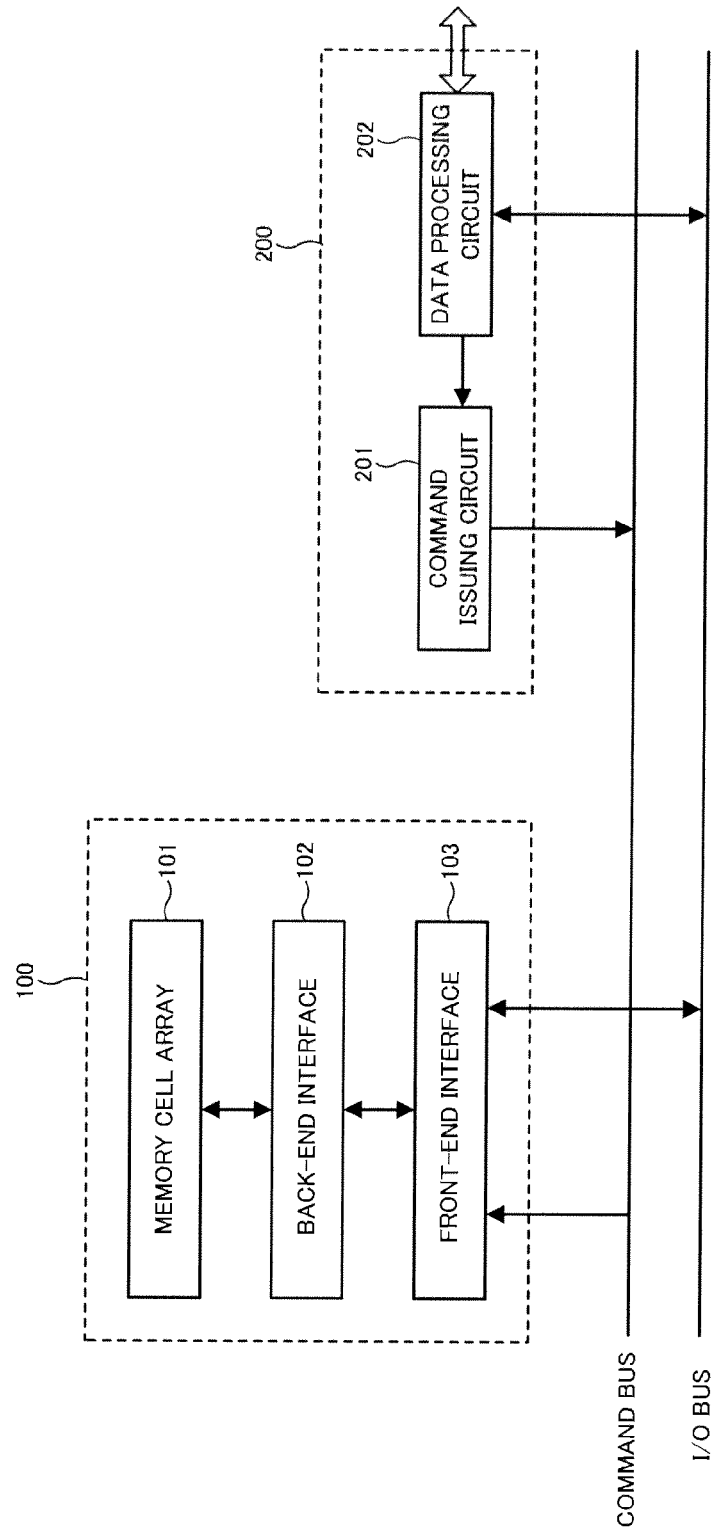
FIG. 10 is a configuration example of a data processing system comprising a semiconductor device having a configuration described in the embodiments and a controller controlling operations of the semiconductor device.

Next, a case in which the present invention is applied to a data processing system comprising a semiconductor device will be described. FIG. 10 shows a configuration example of the data processing system comprising a semiconductor device 100 having the configuration described in the embodiments and a controller 200 controlling operations of the semiconductor device 100.

The semiconductor device 100 is provided with a memory cell array 101, a back-end interface 102 and a front-end interface 103. The memory cell array 101 includes the memory cell array 10 as described in the embodiments. The back-end interface 102 includes peripheral circuits of the memory cell array 10. The front-end interface 103 has a function to communicate with the controller 200 through a command bus and an I/O bus. Although FIG. 10 shows only one semiconductor device 100, a plurality of semiconductor devices 100 may be provided in the system.

The controller 200 is provided with a command issuing circuit 201 and a data processing circuit 202, and controls operations of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device 100 of the embodiments may be included in the controller 200 in FIG. 10.

The data processing system of FIG. 10 is, for example, a system implemented in electronics devices such as personal computers, communication electronics devices, mobile electronics devices and other industrial/consumer electronics devices.

In the foregoing, the present invention that has been described using the embodiments can be widely applied to semiconductor devices of a volatile or non-volatile type that has a hierarchical bit line structure. Further, various circuit configurations can be employed for the circuits of the present invention without being limited to the configurations disclosed in the embodiments and accompanying drawings.

The present invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like, without being limited to the semiconductor device disclosed in the embodiments. Further, the present invention can be applied to various devices such as SOC (System on Chip), MCP (Multi Chip Package), POP (Package on Package) and the like.

Further, transistors of the present invention are Field-Effect Transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an NMOS transistor (N-channel type MOS transistor) is a typical example of a first conductive type transistor, and a PMOS transistor (P-channel type transistor) is a typical example of a second conductive type transistor.

The present invention can be applied to devices based on various combinations or selections of the disclosure of the embodiments. That is, the present invention covers various modifications which those skilled in the art can carry out in accordance with all disclosures including claims and technical ideas.

The invention claimed is:

1. A method for operating a dynamic random access memory having a sense amplifier connected to first and second global bit lines, each global bit line connected to a plurality of local bit lines through a hierarchical switch, each local bit line connected to a plurality of memory cell capacitors through a selection transistor, the method comprising:

precharging the sense amplifier while a first hierarchical switch connecting the first global bit line to a first local bit line and a second hierarchical switch connecting the second global bit line to a second local bit line are in an ON-state;

turning off the first hierarchical switch and turning on a third hierarchical switch connecting the first global bit line to third local bit line;

driving a first word line connected to a first selection transistor to a first level to connect a first memory cell capacitor to the third local bit line;

activating the sense amplifier;

driving the first word line to a second level to disconnect the first memory cell capacitor from the third local bit line; and precharging the sense amplifier while the third hierarchical switch and the second hierarchical switch are in an ON-state.

2. The method as claimed in claim 1, wherein the first and second global bit lines comprise open bit lines.

3. The method as claimed in claim 1, wherein the first level is a high level and the second level is a low level.

4. The method as claimed in claim 1, wherein the hierarchical switches are NMOS transistors.

5. The method as claimed in claim 4, wherein the NMOS transistors are turned on with a boost power supply.

6. The method as claimed in claim 5, wherein the boost power supply is VPP.

7. The method as claimed in claim 1, wherein the sense amplifier is precharged to a voltage between a high level and a low level of the sense amplifier.

8. The method as claimed in claim 1, wherein the word lines are sub word lines.

9. The method as claimed in claim 1, wherein turning off the first hierarchical switch and turning on the third hierarchical switch is performed simultaneously.

10. The method as claimed in claim 1, further comprising:

driving a second word line connected to a second selection transistor to a first level to connect a second memory cell capacitor the third local bit line;

activating the sense amplifier;

driving the second word line to a second level to disconnect the second memory cell capacitor from the third local bit line; and precharging the sense amplifier while the third hierarchical switch and the second hierarchical switch are in an ON-state.

11. The method as claimed in claim 1, further comprising:

turning off the second hierarchical switch and turning on a fourth hierarchical switch connecting the second global bit line to fourth local bit line;

driving a second word line connected to a second selection transistor to a first level to connect a second memory cell capacitor to the fourth local bit line;

activating the sense amplifier;

driving the second word line to a second level to disconnect the second memory cell capacitor from the fourth local bit line; and precharging the sense amplifier while the third hierarchical switch and the fourth hierarchical switch are in an ON-state.

* * * * *